US011309901B2

(12) United States Patent
Påhlsson et al.

(10) Patent No.: US 11,309,901 B2
(45) Date of Patent: Apr. 19, 2022

(54) PHASE LOCKED LOOP ARRANGEMENT, TRANSMITTER AND RECEIVER AND METHOD FOR ADJUSTING THE PHASE BETWEEN OSCILLATOR SIGNALS

(71) Applicant: Telefonaktiebolaget LM Ericsson (publ), Stockholm (SE)

(72) Inventors: Tony Påhlsson, Lund (SE); Staffan Ek, Lund (SE); Henrik Sjöland, Lund (SE)

(73) Assignee: TELEFONAKTIEBOLAGET LM ERICSSON (PUBL), Stockholm (SE)

(*) Notice: Subject to any disclaimer, the term of this patent is extended or adjusted under 35 U.S.C. 154(b) by 824 days.

(21) Appl. No.: 15/580,046

(22) PCT Filed: Jun. 11, 2015

(86) PCT No.: PCT/EP2015/063109
§ 371 (c)(1),
(2) Date: Dec. 6, 2017

(87) PCT Pub. No.: WO2016/198116
PCT Pub. Date: Dec. 15, 2016

(65) Prior Publication Data
US 2018/0138917 A1    May 17, 2018

(51) Int. Cl.
*H03L 7/23* (2006.01)
*H03L 7/089* (2006.01)
(Continued)

(52) U.S. Cl.
CPC ............... *H03L 7/23* (2013.01); *H01Q 3/34* (2013.01); *H03L 7/0898* (2013.01); *H03L 7/091* (2013.01)

(58) Field of Classification Search
CPC ......... H01Q 3/34; H03L 7/0898; H03L 7/091; H03L 7/23
See application file for complete search history.

(56) References Cited

U.S. PATENT DOCUMENTS

| | | | |
|---|---|---|---|
| 6,784,836 B2* | 8/2004 | Kasperkovitz | H01Q 3/42 342/368 |
| 2004/0183571 A1* | 9/2004 | Marzinger | H03L 7/0898 327/2 |

(Continued)

FOREIGN PATENT DOCUMENTS

| | | |
|---|---|---|
| EP | 1386373 A1 | 2/2004 |
| EP | 1458099 A1 | 9/2004 |

(Continued)

OTHER PUBLICATIONS

Yagi et al. ("Phase Control Experiment of the PLL Oscillator for a Phased Array Antenna", 2012 IEEE MTT-S International Microwave Workshop Series on Innovative Wireless Power Transmission: Technologies, Systems, and Applications (IMWS), May 10-11, 2012, 167-170) (Year: 2012).*

(Continued)

*Primary Examiner* — Patrick C Chen
(74) *Attorney, Agent, or Firm* — Murphy, Bilak & Homiller, PLLC

(57) ABSTRACT

A phase locked loop arrangement (1) beamforming comprises two or more phase locked loops. The loops include a phase comparator (21, 22) and an adjustable charge pump arrangement (31, 32) having a loop filter (51, 52) and charge pump current source (41, 42) with an adjustment input ($\phi_{adj}$) connected to the loop filter (51, 52) to inject an adjustable charge pump current into the loop filter. A constant current source (71, 72) is configured to inject a first predetermined charge current into the loop filter (51, 52). The adjustable charge pump arrangements (31, 32) are connected to the respective phase comparators (21, 22) to provide a voltage control signal (vctrl) to an oscillator (61, 62) of the respective phase adjustable phase locked loop (11, 12) in response to the respective control signal (up, down) and to generate a phase deviation between the first and one of the at least one (Continued)

second oscillator signals ($f_{osc1}$, $f_{osc2}$) based on an adjustment signal applied to the adjustment input ($\phi_{adj}$).

12 Claims, 7 Drawing Sheets

(51) Int. Cl.
*H03L 7/091* (2006.01)
*H01Q 3/34* (2006.01)

(56) References Cited

U.S. PATENT DOCUMENTS

| | | |
|---|---|---|
| 2005/0077955 A1 | 4/2005 | Dosho et al. |
| 2005/0189595 A1* | 9/2005 | Okamoto ........ H01L 21/823481 257/368 |
| 2006/0068737 A1 | 3/2006 | Koo et al. |
| 2006/0119405 A1 | 6/2006 | Kobayashi |
| 2007/0247202 A1 | 10/2007 | Lin et al. |
| 2008/0079501 A1 | 4/2008 | Hulfachor et al. |
| 2008/0101521 A1* | 5/2008 | Lee ...................... H03L 7/0898 375/371 |
| 2008/0157835 A1 | 7/2008 | Kimura et al. |
| 2012/0074993 A1* | 3/2012 | Chen ........................ H03L 1/00 327/147 |
| 2015/0094055 A1* | 4/2015 | Mallikarjunan ...... H04W 64/00 455/426.1 |

FOREIGN PATENT DOCUMENTS

| | | |
|---|---|---|
| EP | 1583240 A1 | 10/2005 |
| WO | 0033464 A1 | 6/2000 |

OTHER PUBLICATIONS

Axholt, A. et al., "A PLL based 12GHz LO Generator with Digital Phase Control in 90nm CMOS", Analog Integrated Circuits and Signal Processing, vol. 67, Issue No. 3, 2011, pp. 309-318. (Year: 2011).*

Axholt, A. et al., "A 60 GHz Receiver Front-End with PLL based Phase Controlled LO Generation for Phased-Arrays", IEEE Proc. Asia Pacific Microwave Conference, APMC 2011, Melbourne, Australia, Dec. 2011, pp. 1-119.

Axholt, A. et al., "A PLL based 12GHz LO Generator with Digital Phase Control in 90nm CMOS", Analog Integrated Circuits and Signal Processing, vol. 67, Issue No. 3, 2011, pp. 309-318.

Kihira, Kazunari et al., "A Phased Array Antenna Using Commercial Fractional-N PLL Synthesizers by Clock Shift of LE Signals", 2014 8th European Conference on Antennas and Propagation (EuCAP), Apr. 6-11, 2014, 546-550.

Yagi, Takafumi et al., "Phase Control Experiment of the PLL Oscillator for a Phased Array Antenna", 2012 IEEE MTT-S International Microwave Workshop Series on Innovative Wireless Power Transmission: Technologies, Systems, and Applications (IMWS), May 10-11, 2012, 167-170.

Liu , et al., "All-Digital Dynamic Self-Detection and Self-Compensation of Static Phase Offsets in Charge-Pump PLLs", 2007 IEEE International Solid-State Circuits Conference, Session 9, Clocking 9.3, 2007, 3 pages.

* cited by examiner

PHASE LOCKED LOOP ARRANGEMENT, TRANSMITTER AND RECEIVER AND METHOD FOR ADJUSTING THE PHASE BETWEEN OSCILLATOR SIGNALS

TECHNICAL FIELD

The present disclosure relates to a programmable phase locked loop arrangement, particularly for a beamforming system, to a transmitter and receiver arrangements and to a method for adjusting the phase between oscillator signals.

BACKGROUND

Wireless systems typically upconvert a baseband signal to a Radio Frequency (RF) for transmission, and downconvert received RF signals to baseband for processing. Such frequency conversion requires producing a reliable mixing frequency signal, typically referred to as a local oscillator (LO) signal, for use in the RF front-end of a wireless device. Phase-Locked Loops (PLLs) are often used to provide such mixing frequency signals. In some cases, stringent requirements are placed on the mixing frequency signal, such as produced by a PLL.

It is foreseeable that 5G cellular systems will use millimetre waves, where the frequencies currently in discussion range between 15 GHz and 60 GHz. In order to use such 5G system outdoors, a longer cyclic prefix has to be used compared to newly released 60 GHz indoor systems. Such longer cyclic prefixes necessitate a closer sub-carrier spacing in the OFDM modulation. This closer sub-carrier spacing poses stringent phase noise requirements on the output of the PLLs. At the same time, beamforming should be supported to increase the range and capacity of the system, which results in a large number of antenna elements. The signal at each antenna element of a beamforming system will have an individual phase shift that controls the beam and in particular the beam direction. In some implementations, the beam controlling phase shifts are imposed on the oscillator signal generated by the PLL. In any event, accurate phase shifts are required to provide accurate beamforming. It is also desirable to be able to program the frequency of the oscillator signal to enable the wireless device to operate on different frequency channels and in different bands.

Despite the ability to introduce a programmable phase shift and programmable frequency, the local oscillator generation circuitry shall also achieve a low phase noise and other aspects without consuming excessive power.

SUMMARY

As a result of all of these considerations, the inventors have realized that it would be beneficial to improve the generation of the oscillator signals so as to provide the desired phase shift programmability.

The solution presented herein proposes to control the phase between the reference signal and the feedback signal and the phase of an oscillator output signal of a phase locked loop by controlling the level of the charge or discharge current in an innovative way.

In an aspect of the disclosure, a phase locked loop arrangement beamforming comprises a plurality of phase-adjustable phase locked loops. All phase locked loops are configured to provide a respective oscillator signal. Each of the phase adjustable phase locked loops comprise a frequency divider to provide a frequency divided signal based on the oscillator signal, a phase comparator and an adjustable charge pump arrangement. The phase comparator is configured to output a respective control signal in response to a detection of a phase deviation between a common reference signal and the respective frequency divided signal. The adjustable charge pump arrangement comprises an adjustable charge pump with an adjustment input and a loop filter coupled thereto. It is further connected to the phase comparator to provide a voltage control signal to an oscillator of the respective phase adjustable phase locked loop in response to the respective control signal. The adjustable charge pump arrangement also comprises a constant current source configured to inject a first predetermined charge current into the loop filter. The adjustable charge pump arrangement is also configured to generate a phase shift between an oscillator signal of one of the plurality of phase locked loops and an oscillator signal of at least another one of the plurality of phase locked loops based on an adjustment signal applied to the adjustment input.

The present disclosure provides a very flexible solution to meet the requirements for beamforming systems. Each of the adjustable phase locked loops can be individually adjusted in phase resulting in a well-defined phase shift between the loops. The arrangement can therefore be used for many variances of beamforming systems. In accordance with the present proposal, the phase shift is adjusted by varying the current within the charge pump of each of the phase locked loops. The constant current source of the charge pump arrangement injects a constant current into the loop filter, acting to accumulate charge in the loop filter. To keep the phase locked loop locked, the phase comparator will activate the adjustable charge pump to compensate for the injected current, maintaining the loop filter charge. Thus a phase skew is introduced in the oscillator's output signal. The charge pump therefore implements two functions, namely to adjust the frequency of the output oscillator signal so that the frequency of the frequency divided signal matches a frequency of a reference signal and to introduce a dedicated and determined phase shift. In this regard, the term "phase shift" or "phase skew" shall describe a desired deviation of the phase with respect to a nominal phase. In other words, the adjustment of the charge pump current provides a specific phase shift between an oscillator signal of a first one of the phase locked loops and an oscillator signal of a second one of the phase locked loops, both loops using a common reference signal. The charge pump current also provides high accuracy in the phase adjustment, while implementing the adjustment in the charge pump might be more space efficient than a different solution.

In an aspect, the DC current injected in the loop filter for each phase locked loop is chosen such that the resulting phase in the output signal of the respective phase locked loop is equal to a nominal phase. Hence, the constant current source may also be used to compensate design deviations in the proposed phase locked loop arrangement. In a further aspect, the respective control signal of the phase comparator is applicable to a switch in the adjustable charge pump controlling injection current into the loop filter. The phase comparator and the switch are therefore configured to inject a charge pulse into the loop filter, wherein the height of the pulse is given by the adjustable charge pump and the length of the pulse by the phase comparison in the phase comparator. In this regard, the loop filter may comprise a capacitor configured to output the voltage control signal based on an amount of charge accumulated on the capacitor.

In another aspect, the charge pump of phase locked loop arrangement each comprise a reference current side configured to receive a fixed reference current and to generate an adjustable reference current. An output current side is configured to provide an output current based on said adjustable reference current. The adjustment of the reference current side corresponds to a non-linear adjustment function compensating a nonlinear behaviour in the phase deviation in response to a change in the charge current. As a result, the overall phase deviation becomes a linear or almost linear function of the current adjustment.

In an aspect, the adjustable charge pump of the charge pump arrangement comprises a current mirror. Said current mirror has non-linearly adjustable transfer ratio between its input and its output side. More particular, in an aspect, a reference current side of the charge pump comprises a first transistor and at least one second transistor arranged in parallel to the first transistor, both transistors selectively switchable to conduct an adjustable portion of the reference current. In case of a current mirror being part of the charge pump, the input side of the current mirror comprise at least two transistors arranged in parallel and selectively switchable to conduct a portion of the reference current.

In an aspect, each of the charge pumps of the plurality of phase locked loops comprise a source path to provide a charge current and a drain path to provide a discharge current. At least one of those respective source and drain paths may be configured to provide an adjustable current, respectively. The charge and discharge path enables the phase locked loop not only to adjust the frequency of its respective output signal so that the frequency of the frequency divided signal matches the reference frequency, but also to control a respective positive or negative phase shift injected by the constant current source.

In yet another aspect, the frequency divider of each of the plurality of phase adjustable phase locked loops in the arrangement is an adjustable one. The frequency divider is operatively arranged between an output of the oscillator and an input of the phase comparator to provide a frequency divided signal to the phase comparator based on the oscillator signal and a frequency control word. The frequency control word might be an integer number, resulting in an integral frequency division, but also a rational number corresponding to a non-integral division. As a result, the plurality of phase locked loops can individually be adjusted in their respective frequencies and phase. As their output signals are derived from a common reference signal it is particular possible to have specific frequency and phase relationships between their respective output signals by applying proper frequency and phase adjustment signals. In an aspect, the phase locked loop arrangement comprises a reference signal generator configured to provide the common reference signal to each of the first and at least one second adjustable phase locked loop.

The proposed phase locked loop arrangement can be implemented in any transceiver and particular in a beamforming system. The term transceiver in this regard corresponds to any device or arrangement being able to transmit as signal, to receive a signal or both. Consequently, an aspect of the disclosure is related to a transmitter arrangement, said transmitter arrangement comprising an antenna array having a plurality of antenna elements. Each of the antenna elements is in operative connection to a respective one of the adjustable phase locked loops of the phase locked loop arrangement to receive an individual signal for transmission derived from the respective oscillator signal thereof. In accordance with the disclosure, the phase locked loop arrangement is implemented in a beamforming system having a plurality of antenna elements forming an antenna array.

Control of the beam direction is achieved by the supply of phase shifted signals to the respective antenna elements in transmission provided by the proposed phase locked loop arrangement. In another aspect, a receiver arrangement comprises the proposed phase locked loop arrangement and an antenna array. Said array comprises a plurality of antenna elements, wherein each of the antenna elements is coupled to a respective one of the adjustable phase locked loops to downconvert a received signal with the respective oscillator signal thereof.

Another aspect is related to a method for adjusting a phase between oscillator signals. A first and a second oscillator signals having the same frequency as well as a common reference signal are generated. Each of the oscillator signals is frequency divided to obtain a frequency divided signal. In a subsequent step respective control signals are generated. Those control signals are responsive to a phase deviation between the common reference signal and the first frequency divided and the second frequency divided signal, respectively. Respective current pulses from respective charge or discharge currents are generated. A length of the respective current pulses is responsive to one of the control signals to control the frequency of the respective first and at least one second oscillator signal. Further, a constant current is injected into the loop filter to create a phase skew and the charge currents are adjusted individually to control the phase skew.

In an aspect, the respective charge currents differ from each other as to skew a phase between the first oscillator signal and the second oscillator signal. The advantages and benefits of the solutions presented above also apply to the proposed method in accordance with the present disclosure.

BRIEF DESCRIPTION OF THE DRAWINGS

Further aspect, embodiments and advantages of the present disclosure will become apparent in the following detailed description accompanying the following drawings, in which.

ABBREVIATIONS

Figure 1:
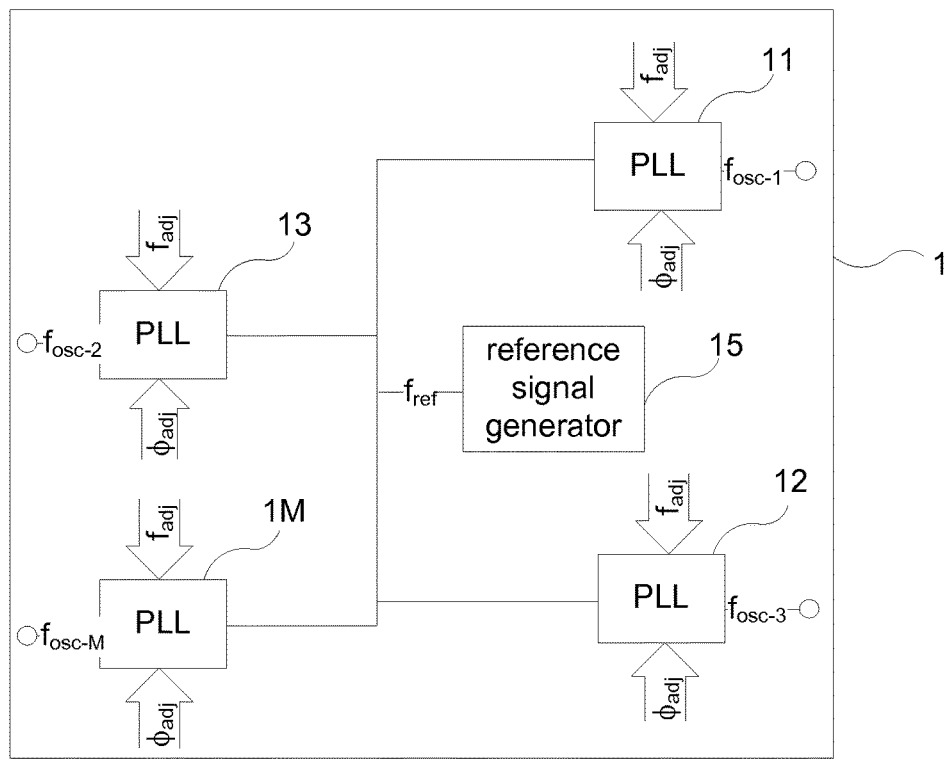
FIG. 1 illustrates a first embodiment of a phase locked loop arrangement for a beamforming system.

OFDM Orthogonal Frequency Division Multiplex
PLL Phase locked loop
LO Local oscillator
VCO Voltage Controlled Oscillator
DIV Divider
LPF Low Pass Filter
PFD Phase Frequency Detector
DC Direct Current
W Width of a transistor
L Length of a transistor
LSB Least Significant Bit
MSB Most significant Bit

DETAILED DESCRIPTION

In this regard the term "reference frequency" shall refer to a reference signal having a predetermined frequency. As the reference signal is commonly applied to all phase locked loops (except otherwise noted), the frequency of said signal applied to the loops shall be the same. The term "Common" in this regard means that in operation each phase comparator is applied with the same reference signal. Due to different reference signal propagation, the reference signal may have different phases at the respective input terminals of the phase locked loops. By choosing appropriate designs or other measures these phase deviations can be compensated. Alternatively, one may make use of those differences as the shift in between the respective loops is known and depends inter alia from the different length of the signal lines. The term "frequency" or "phase adjustment signal" shall include any kind of analogue adjustment signal, but also any digital frequency or phase adjustment word. Such words include parallel and serial signals. A digital word can be applied directly, wherein the respective bit values are applied directly to switches and the like, but also be converted to analogue voltage or current signals using digital-analogue-converters and the like. The terms "phase shift" and "phase skew" shall mean the same for the purpose of this disclosure. The term transistors shall include field-effect transistors and/or bipolar transistors except where otherwise stated. The terms "phase comparator", "phase detector" and "phase-frequency" detector shall refer to the same element except otherwise stated.

It is foreseeable that the next generation of cellular systems and wireless communication will use frequencies in the higher GHz frequency range, that is above 15 GHz and up to 60 GHz. Outdoors in rural and urban areas the signal echoes will have longer delays than indoors, so longer prefixes resulting in closer sub-spacing in the proposed underlying OFDM modulation is required compared to indoor only systems. Consequently, phase noise and other requirement concerning the signal quality are increased to achieve a reliable data transmission enabling high data throughput. Furthermore, the signal attenuation at these frequencies will be high in a cellular system, which can be mitigated using beamforming systems. Such beamforming systems include a large number of antenna elements in an array, being able to transmit or receive in a dedicated direction. To control the beam or receiving direction, a dedicated phase shift of the signal must be applied to each respective antenna element. In a key implementation it has been proposed to establish such phase shift in the local oscillator signal provided by a PLL coupled to the respective antenna element.

In addition, the phase locked loop comprises a feedback path, normally including a programmable frequency divider circuit dividing the output oscillator signal by a pre-determined ratio and feeding the frequency-divided signal back to the phase comparator. As a result, the phase comparator using a common reference signal, the output signals of the PLLs will lock in different well defined phase relations. Regardless of scheme used for the frequency division, integer-N or fractional-N, there is a need to control the phase of the output signal of the different PLLs.

A solution for generating the local oscillator signals with some control for its phase is for example illustrated in A. Axholt, H. Sjöland, "A PLL based 12 GHz LO generator with digital phase control in 90 nm CMOS", Analog Integrated Circuits and Signal Processing, Vol. 67, No. 3, pp. 309-318, 2011. Another example is shown in A. Axholt and H. Sjöland, "A 60 GHz Receiver Front-End with PLL based Phase Controlled LO Generation for Phased-Arrays", IEEE Proc. Asia Pacific Microwave Conference, APMC 2011, APMC 2011, December 2011, Melbourne, Australia. In both cases, an additional adjustable current source injects a current into the loop filters of each local PLL, which will produce a phase shift of the output signal. In equilibrium, the loop becomes frequency and phase locked and will strive to return in case of deviations, so the loop reacts to the "disturbance" caused by the injected current by a proportional phase-skew between the reference signal and the feedback signal at the input of the phase detector.

In the examples shown in prior art, a phase-skew of one output cycle-, that is 360° phase at the frequency of the output signal-, between the reference signal and the feedback signal corresponds to a charge-pump charge pulse of $I_{CHP}*(1/f_{osc})$. The current injected by the current source that corresponds to this charge pulse is transferred over (or "smeared out" over) the whole signal period of the reference signal $f_{ref}$. As a result, the ratio between the charge pulse current and the current injected by the current source becomes dependant from the divider ratio N within the feedback path of the phase lock loop:

$$I_{CHP}*(1/f_{OSC})=I_{DC}*(1/f_{REF})$$

$$I_{DC}=I_{CHP}*(f_{REF}/f_{OSC})=I_{CHP}/N$$

For a 1-degree phase change, the required injected current becomes $$I_{DC}=I_{CHP}/(N*360) \quad (1)$$

As the output frequency of the oscillator signal is in the range of 20 GHz, while the reference frequency is about 300 MHz, one can assume under normal circumstances a divider ratio N between 50 and 100. If one assumes a divider ratio of N=70, the injected $I_{DC}$ current charge for a 1-degree phase skew becomes about 25000 times smaller than the charge pump current. As the accuracy of current ratios is typically limited by the matching properties, designs of current sources with good matching at such ratios are needed. It is difficult to realize current sources with this enormous ratio while maintaining good matching accuracy, for instance the technique of using unit current sources of equal design would require 25000 units for each current source. Hence, the solutions as stated above will call for a trade-off resulting in either phase control with bad accuracy or large chip area.

The solution proposes to control the phases of a plurality of oscillator output signal of phase locked loops in a phase locked loop arrangement by instead changing the charge pump pulse current. By changing the charge pump pulse current, the respective phase locked loop will compensate by changing the pulse duration, so that the total pulse charge remains constant. For this purpose a further small dedicated and constant DC current is injected which will set the average current pulse that the charge pump must provide in the steady state.

Figure 3:
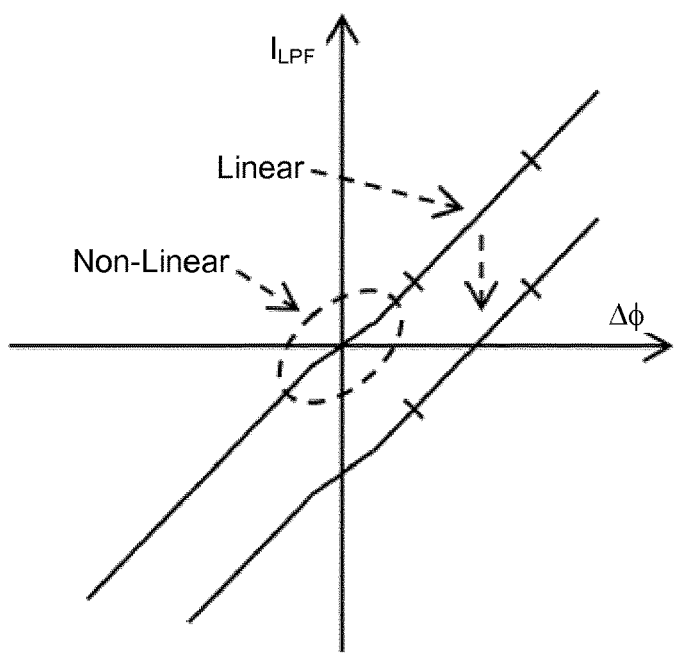
FIG. 3 illustrates the charge-phase relationship in accordance with aspects of the present disclosure.

FIG. 3 illustrates the relationship between the charge current injected into the loop filter and the phase skew as an output thereof. In the area of the zero phase region, marked by the circle, the transfer function is highly non-linear due to timing errors when producing ultra-short pulses in the phase comparator. Particular for small phase deviation, the phase comparator may not provide a well-defined control signal resulting either in noise or in non-linearities when switching on or off the respective charge pumps. Injecting a small DC current has the additional benefit of shifting the transfer function from the zero phase region.

Figure 7:
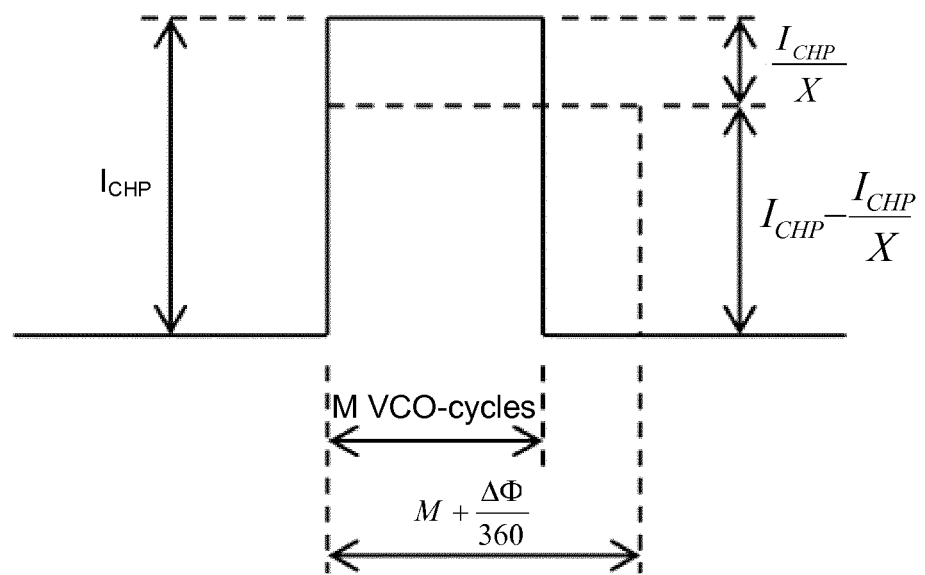
FIG. 7 shows a visual representation between the injected charge current and the corresponding phase shift.

As a result and as illustrated in FIG. 7, the charge pump produces pulses (straight line) of a certain length M to remain in equilibrium. The charge pump current is set to $I_{CHP}$. By shifting the transfer function as shown in FIG. 3, one of the pumps of the charge pump has to be used in the state when the PLL is locked, preferably the least noisy. The length M is chosen to be a couple of periods of the oscillators output signals, i.e. long enough that the dynamics of any variable divider in the feedback path fits and that still only one of the pumps need to be in use when the PLL is locked. In this way the transfer function of the phase comparator and charge pump is kept linear.

In the steady state situation, in which the charge pump current is set to a certain value to compensate for the injected DC current, the average charge transfer, the area below the straight or dotted line in FIG. 7, given by the pulse length from the phase comparator must correspond to the injected DC current according to the following equation:

$$M \cdot \frac{1}{f_{VCO}} \cdot I_{CHP} = \left(I_{CHP} - \frac{I_{CHP}}{X}\right) \cdot \left(M + \frac{\Delta\Phi}{360}\right) \cdot \frac{1}{f_{VCO}} \quad (2)$$

M is the pulse length and set in periods of the output signal of the oscillator of the phase locked loop, the phase skew $\Delta\Phi$ is the phase deviation of the output VCO signal introduced by the change in charge pump current from $I_{CHP}$ to $I_{CHP}*(1-(1/X))$. Equation (2) can be re-written into $$\frac{I_{CHP}}{X}\left(M + \frac{\Delta\Phi}{360}\right) = I_{CHP} \cdot \frac{\Delta\Phi}{360} \quad (3)$$

$$X = 360 \cdot \frac{M}{\Delta\Phi} + 1$$

As 1/X corresponds to a portion of the charge current being adjusted, the charge pump current $I_{CHP}$ required to produce a phase shift of $\Delta\Phi$ becomes:

$$\frac{I_{CHP}}{X} = I_{CHP} \cdot \frac{\frac{\Delta\Phi}{360}}{M + \frac{\Delta\Phi}{360}}$$

and for a 1 degree phase shift this simplifies to $$\frac{I_{CHP}}{X} = \frac{I_{CHP}}{M*360 + 1} \quad (4)$$

As the product of pulse length and charge pump current stays the same in steady state, one can obtain the necessary charge pump current $I_{CHP}-I_{CHP}/X$ to obtain a phase skew between the reference signal $f_{ref}$ and the feedback signal $f_{feedback}$ corresponding to a phase deviation $\Delta\Phi$ of the output VCO signal, given by $$I_{ref,\Delta\Phi} = I_{CHP} - \frac{I_{CHP}}{X} = I_{CHP} \cdot \left(\frac{M}{M + \frac{\Delta\Phi}{360}}\right) \quad (5)$$

Using equation (4) and under the assumption of a nominal pulse length of M=4, equal to 4 periods of the oscillator's output signal the ratio between $I_{CHP}$ and $I_{CHP}/X$ becomes about 1440. As a result phase control using a current injection by the charge pump requires a different ratio compared to the ratio of equation (1). Such current ratio is simpler to implement with high accuracy by proper design of the current sources.

FIG. 1 illustrates an embodiment of a phase locked loop arrangement 1 in accordance with some aspects of the present disclosure. The arrangement comprises a plurality of phase locked loops 11, 12, 13 to 1M. Although 4 phase locked loops are shown herein, the number of phase locked loops is not restricted to this number. As each phase locked loop supports an antenna element of an antenna array the number of phase locked loops is in relation to the number of antenna elements. Each phase locked loop 11 to 1M is connected to a reference signal generator 15 providing a common reference signal $f_{ref}$ to all phase locked loops. Further, each of the phase locked loops provides a respective oscillator signal $f_{osc-1}$ to $f_{osc-M}$, having a dedicated frequency which is adjusted and selected by a frequency control word $f_{adj}$ applied to the respective phase locked loop. In case the frequency control word $f_{adj}$ of two phase locked loops is the same, the respective output signal $f_{osc}$ will have the same frequency due to the common reference signal $f_{ref}$ applied thereto. However, each phase locked loop 11 to 1M also comprises an input for a phase adjustment word $\varphi_{adj}$. Each phase locked loop is configured to set the phase of its output signal $f_{osc}$ relative to a nominal reference phase. In case of the above example, wherein the frequency of respective output signals $f_{osc}$ of two or more phase locked loops are the same, the phase adjustment enables each phase locked loop to skew its phase. As a result, any phase deviation can be set between two or more output signals $f_{osc}$.

Figure 2:
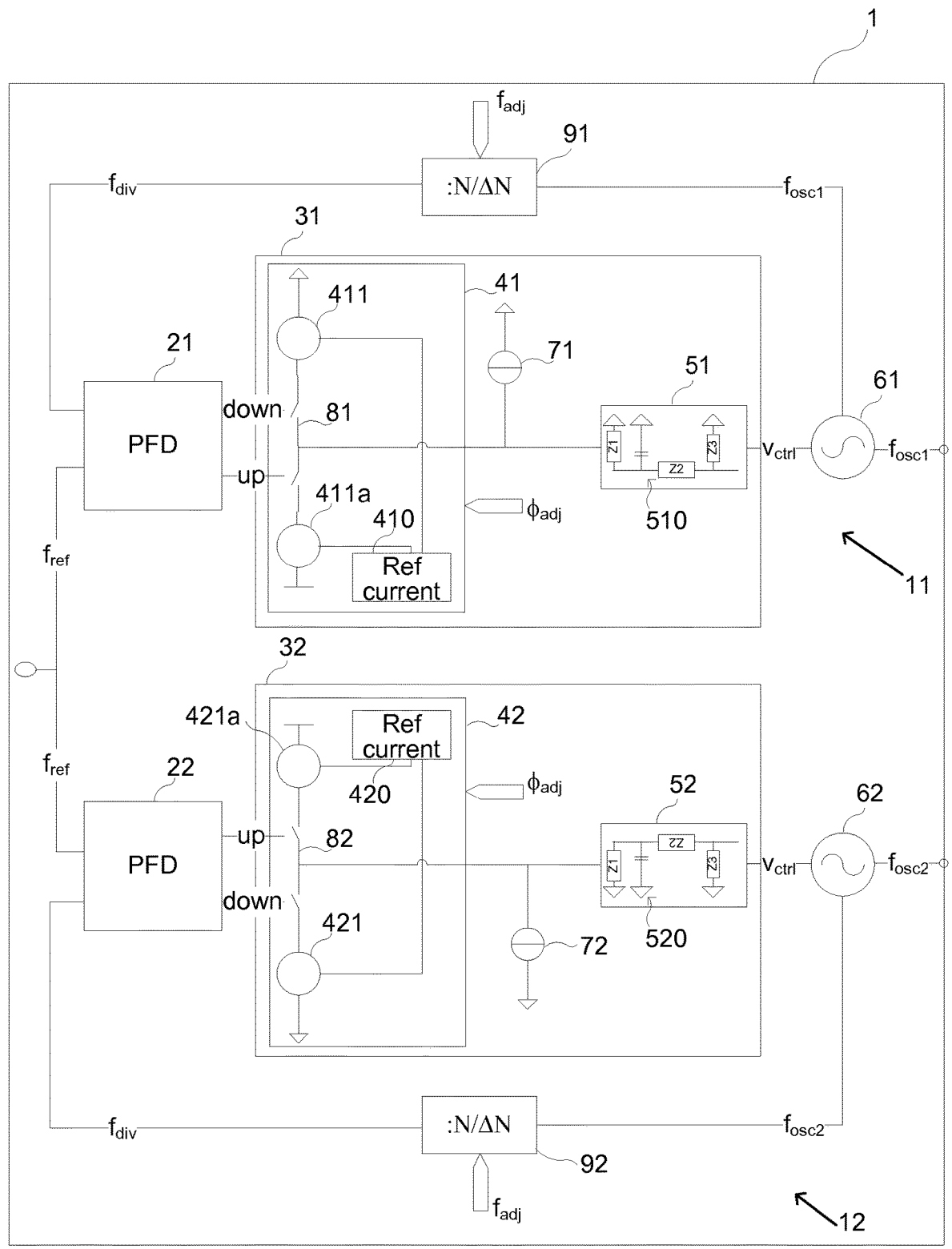
FIG. 2 shows a second detailed embodiment of a phase locked loop arrangement for a beamforming system.

FIG. 2 shows a more detailed view of an arrangement 1 having two phase locked loops 11 and 12. Each phase locked loop 11, 12 is implemented in the same way, so only one of the phase locked loops will be described in greater detail. Phase locked loop 11 comprises a forward path having a phase-frequency comparator 21, —short "phase comparator",— a charge pump arrangement 31 connected downstream phase comparator 21 and an oscillator 61 connected to charge pump arrangement 31. The charge pump arrangement 31 provides and adjustable voltage control signal $v_{ctrl}$. Oscillator 61 receives the voltage control signal $v_{ctrl}$ from charge pump arrangement 31 to adjust its output frequency and/or phase.

The output signal is also applied to a feedback path having an adjustable frequency divider 91 and coupled between oscillator 61 and a feedback input of phase comparator 21. The oscillator 61 provides the output signal $f_{osc1}$ with a frequency of several GHz, for example between 10 and 30 GHz of phase locked loop 11. Those frequencies can be processed by the divider 91. Higher frequencies can be achieved by a multiplication unit (not shown) arranged downstream to the oscillator. The frequency divider 91 is implemented as an adjustable integral or fractional frequency divider having an adjustment input, at which the divider ratio can be set using a respective frequency control word. With the adjustable divider ratio, phase locked loop 11 can achieve different desired output frequencies in a given range.

Figure 6:
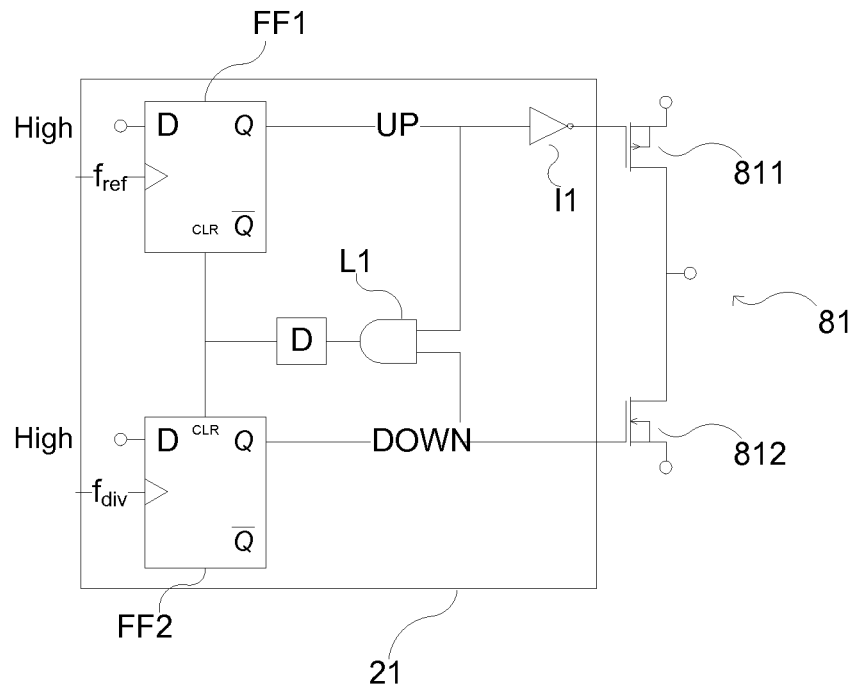
FIG. 6 illustrates an embodiment of a phase comparator.

Phase comparator 21 in the forward path compares the phase of the frequency divided signal $f_{div}$ from the feedback path with the phase from the common reference signal $f_{ref}$ and output a control signal up, down corresponding to the phase difference or phase deviation. An embodiment of a phase comparator is illustrated with respect to FIG. 6. The phase comparator 21 comprises two positive-edge triggered D-Flip-flops FF1 and FF2, wherein their respective signal inputs D are put to HIGH-state. At the clock inputs the reference signal $f_{ref}$ and the feedback signal $f_{div}$ are applied. Data output Q of flip-flop FF1 is connected to inverter I1 and to an input of a logic AND-gate L1. Output of inverter I1 is connected to a gate of switch 811 of a switch 81 of the charge pump arrangement. Output Q of flip-flop FF2 is connected to the other input of logic gate L1 and to gate of switch 812 of the charge pump arrangement. Both switches 811, 812 are coupled to a common output. Output of logic Gate L1 is coupled via delay element D to the reset inputs CLR of the two flip-flops. When both outputs Q are high, gate L1 will disable the FF1 and FF2 after some delay, causing a reset pulse. Without delay element D, the disablement of flip-flops FF1 and FF2 may cause the outputs Q to a high impedance state, stopping the phase comparator from working by producing neither positive nor negative current pulses. In case of phase or frequency deviation between the reference signals and the feedback signal, one of the flip-flops FF1, FF2 produce a respective longer control signal up or down.

Said control signal is applied to the charge pump arrangement 31 and more particular to switch 81 of arrangement 31. Charge pump arrangement 31 comprise a charge pump 41 with two current sources 411 and 411a and a switching circuitry 81 coupled to a loop filter 51. Loop filter 51 comprises a capacitor 510 accumulating charge provided by the charge pumps 41. Loop filter 51 may also comprise further elements Z, like resistors and capacitors to improve loop phase margin and better supress reference frequency modulation of the oscillator.

In case of a phase deviation between $f_{div}$ and $f_{ref}$ primarily one of the switches 81 is operated coupling one of the charge pump current sources to the loop filter. The charge pump applies a dedicated current $I_{CHP}$ to the loop filter charging or discharging its capacitors, thereby changing the control signal $V_{crtl}$ to the oscillator 61. In accordance with the disclosure, charge pump arrangement 31 also comprises a constant current source 71 injecting a constant current into loop filter 51. In this example current source is connected between loop filter and ground, thus effectively discharging the capacitors of loop filter 51. In steady state, to compensate this current, phase comparator 21 activates switch 81 for current source 411a to inject a corresponding average charge pump current into the loop filter. The pulse length of said charge pump current pulse is such that the resulting charge equals the charge injection by DC current source 71. As a result, the charge pump injecting pulses of a certain length corresponds to a proportional phase difference at the phase comparator input, corresponding to an output signal phase skew. Furthermore as an additional beneficial side effect, the transfer function is shifted from the nonlinear zero-phase region to a linear region as illustrated in FIG. 3.

Optionally, charge pump arrangement 31 comprises a reference current source 410 connected to the charge pump current source 411 and 411a to provide a reference current from which the charge pump current is derived. To control the skew of the phase of the output signal $f_{osc}$, arrangement 31 comprises a phase adjustment input for a phase adjustment word $\phi_{adj}$ and the charge pump current $I_{CHP}$ is adjustable in response thereto. Particular, the reference current source is implemented as an adjustable current source and the phase adjustment word applied to the reference current source accordingly. The adjustment is made such that it compensates the non-linear relation between the phase shift $\Delta\phi$ and the charge pump current $I_{ref,\Delta\phi}$ shown in equation (5).

For example, such adjustment can be achieved by removing a portion of the reference current from which the charge pump current is derived. As the relationship between $I_{ref,\Delta\phi}$ and $\Delta\phi$ is nonlinear, the change of a desired phase shift will also become non-linear. For example to achieve a phase shift of $2*\Delta\phi$, one has to subtract a current $I_{ref,2\Delta\phi} \neq 2*I_{ref,\Delta\phi}$ in accordance with equation (5). To obtain a linear phase control, the present disclosure proposes to add or subtract some of the charge pump current $I_{CHP}$ by using transistors. One way to achieve this is using a specifically designed current mirror, wherein the reference current side is adjusted and the adjusted reference current is mirrored into the output side of the current mirror. Such current mirror and its implementation principle are illustrated in FIG. 8.

Figure 8:
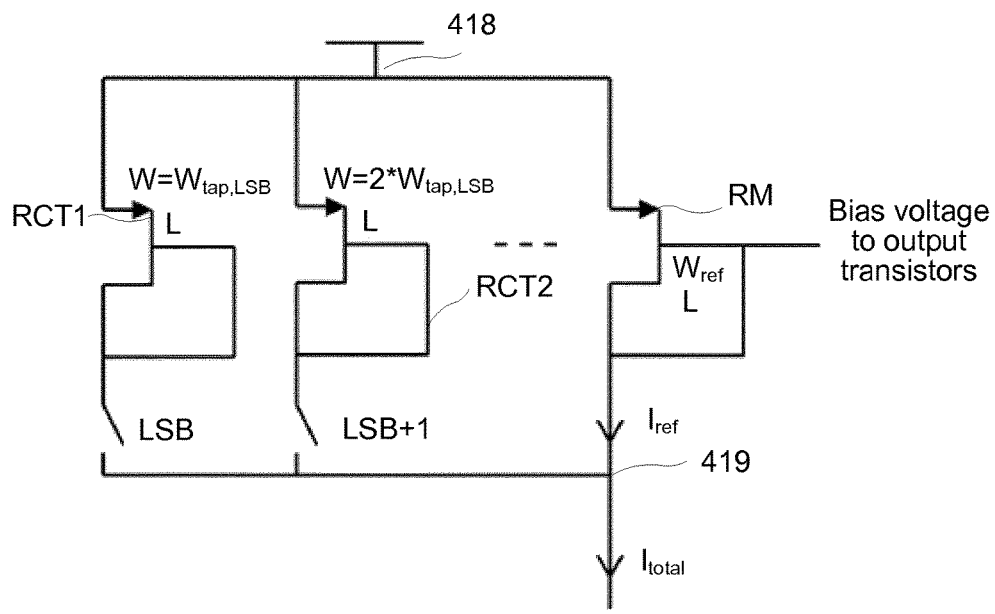
FIG. 8 illustrates an embodiment for a linearization using a current mirror in a charge pump.

FIG. 8 shows a portion of a current mirror, namely the mirror side having a plurality of tapping transistors switchable arranged in parallel between terminals 418 and 419, respectively. The transistors RCT1 to RCTN are diode connected, i.e. their gates are coupled to their respective drains. Transistor RM is the mirror transistor and also connected with its gate to its drain, but also to the output transistor (not shown) of the current mirror.

As the output current of a current mirror is substantially depending on current through the mirror transistor and the geometry ratio between the respective mirror and output transistors, the output current can be adjusted by varying the mirror transistor current, $I_{ref}$. By switching in tapping transistors, current is subtracted from $I_{ref}$ making it less than $I_{total}$. This gives an equation (6) similar to equation (5) as above, wherein the two nonlinearities cancel each other out and we get a linear relation between the amount of "tapped-in" transistors and phase of the output signal. Thus, we are introducing a non-linearity to cancel the non-linearity described above.

$$I_{ref} = I_{total} \cdot \left(\frac{W_{ref}}{W_{tot}}\right) = I_{total} \cdot \left(\frac{W_{ref}}{W_{ref} + W_{tap}}\right) \qquad (6)$$

The ratio between $W_{ref}$ and $W_{tot}$ in equation (6) is the measure on how much of the biasing current $I_{total}$ in FIG. 8 reaches the transistor RM that biases the UP-output-transistor of the charge pump. If $W_{tot}$ equals $W_{ref}$ i.e. $W_{tap}=0$, no tapping transistors are switched in, then $I_{ref}$ equals $I_{total}$. In case a different phase shift is desired, one or more of the transistors RCT1 to RCT2 are switched into the current path in accordance with the phase adjustment signal (LSB, LSB+1). Under the assumption that all transistors comprise the same length and a width as stated in the Figure, another way of deriving equation (6) is to regard $I_{total}$ as the input current to a current mirror with an effective transistor width of $W_{tot}=W_{ref}+W_{tap}$. If more tapping transistors RCT are tapped in, the overall width changes to $W_{tot}=W_{ref}+X*W_{tap,LSB}$, wherein x is the weighted amount of transistors tapped-in. Such additional tapping results in a non-linear behaviour, The more tapping transistors with its weighted width W are tapped-in the less impact on the current $I_{ref}$ occurs, but the "length-impact", i.e. change on the charge pump pulse length will be linear.

If the transistors width $W_{ref}$ of Transistor RM in equation (6) has a specific ratio to M in equation (5), then one has to design the width $W_{tap}$ of the tapping transistors with the same ratio to $(\Delta\Phi/360)$ to a certain phase of the output signal. Setting $W_{ref}$ to M*k and $W_{tap}$ to $\Delta\phi*k/360$ provides a linear control of the phase with the phase being proportional to a binary control word for the tapping transistors. The factor k is a design factor of the transistors.

Figure 9:
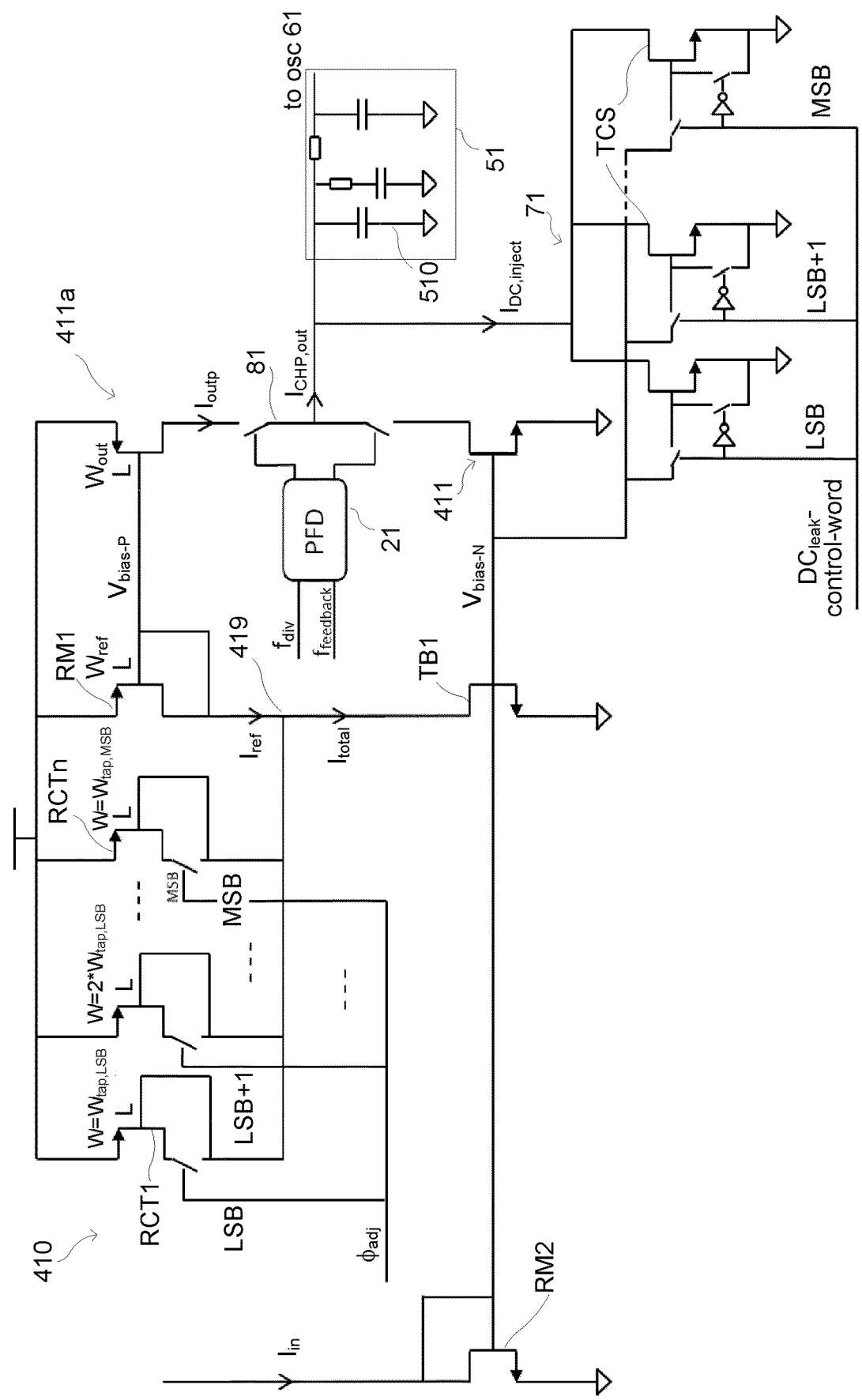
FIG. 9 illustrates more detailed view of an embodiment of a charge pump arrangement according to the present disclosure.

Turning now to FIG. 9, a more detailed view of a charge pump arrangement in accordance with the present disclosure is presented. The charge pump current source 411a coupled to switch 81 is realized as an output transistor of a current mirror, whose input side is adjustable to provide a varying reference current $I_{ref}$. The input side corresponds to current adjustment circuit 410. It comprises a plurality of binary weighted tapping transistors RCT1 to RCTn arranged in parallel. In this example the transistors are implemented as p-channel field-effect transistors. Each of the tapping transistors RCT1 to RCTn is connected via a respective switch to node 419. The respective switches are controlled by a phase adjustment word $\phi_{adj}$. The tapping transistor RCT1 to RCTn each comprise a certain length L and width W. While length L of the tapping transistors are the same, their respective width can be binary weighted as well. In case of binary weighting, the tapping transistor RCT1 corresponding to the least significant bit has the smallest width, with doubling the width W with each tapping transistor. The tapping transistor of bit n comprises a width W corresponding to $2^n*W_{tab,LSB}$, where n=0 is the lease significant bit LSB. Mirror transistor RM1 comprises the same length L and a width $W_{ref}$ setting the ratio of the output current to the reference current of the current mirror, $W_{out}/W_{ref}$. The current $I_{total}$ flowing through the mirror transistor RM1 and the tapping transistors is set by the bias transistor TB1, which is coupled with its gate to mirror transistor RM2. Said transistor RM2 also provides the bias signal $V_{biasN}$ for charge pump current source transistor 411. Under the assumption that the phase adjustment range shall cover 360° and binary weighted tapping transistors, the resolution is limited by the number of tapping transistors to $360/2^N$, wherein N is the number of tapping transistors. For N=8 the resolution is limited to about 1.4°.

In addition, the DC current source 71 also comprises a plurality of switchable current paths to inject a constant but adjusted DC current based on the bias signal $V_{biasN}$. The discharge current is controlled by a digital $DC_{leak}$ control word. Current source 71 comprises a plurality of n-channel field effect transistors TCS connected as switchable current sources arranged in parallel. A first switch is coupling a gate of each transistor to the bias signal $V_{biasN}$. A second switch is arranged between the gate and the source terminal of the respective transistor and coupled via an inverter to an adjustment input to be controlled in response to the $DC_{leak}$ control word. The plurality of transistors TCS can be binary weighted in a similar manner as the tapping transistors. Their respective length and width may be of course different from the tapping transistors.

Figure 10:
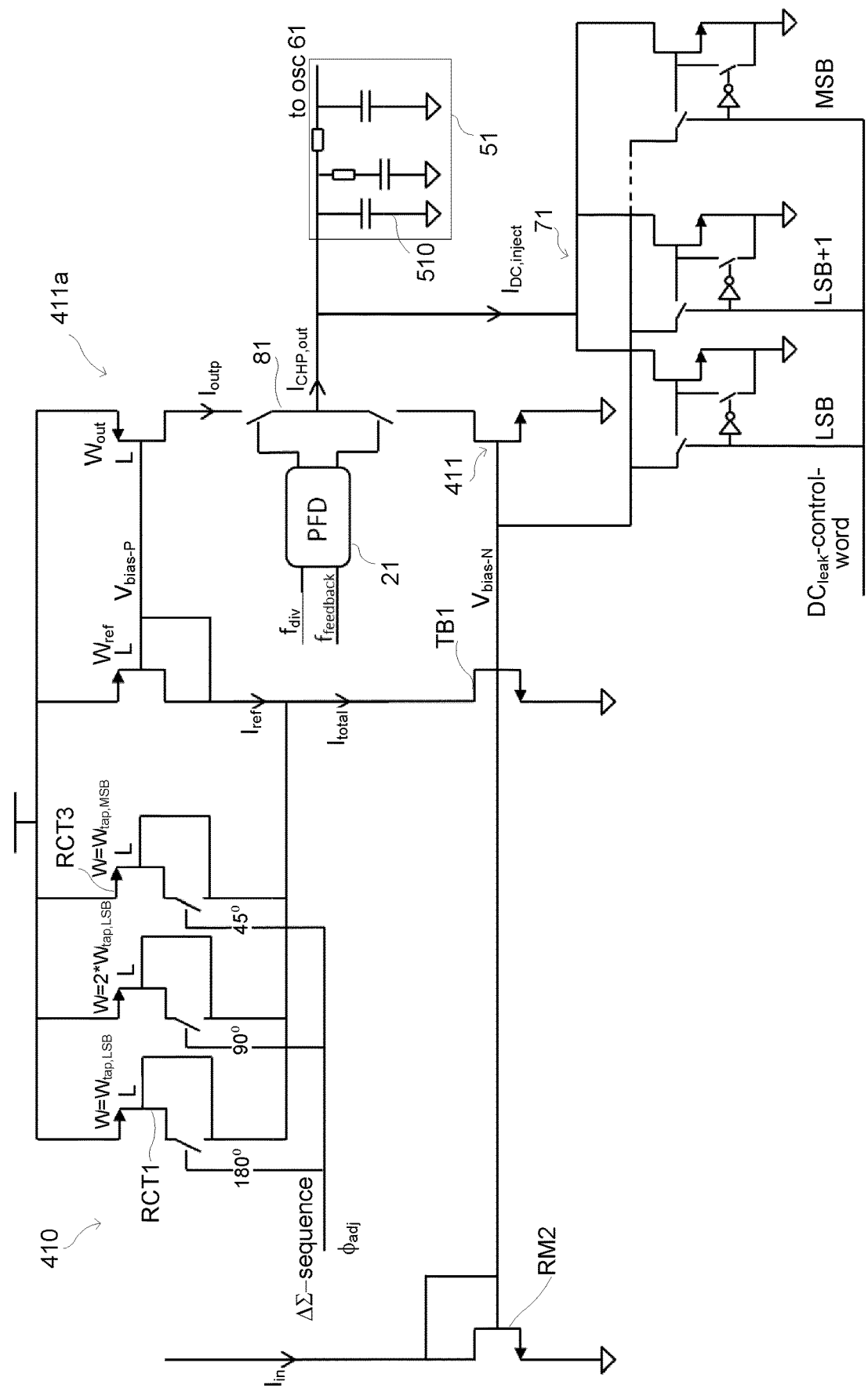
FIG. 10 shows another example of a charge pump arrangement according to the present disclosure.

The benefit of using the current mirror transistor RM2 for biasing both charge pumps 411, 411a and the DC current source 71 lies in the matching behaviour. Any change in the output current of the charge pump due to process or temperature variations will result in a change in the injection current $I_{DC,inject}$ by the same ratio phase of the output signal will be stable versus variations FIG. 10 shows a similar arrangement for a charge pump arrangement. However, the amount of tapping transistors is reduced due to the use of a ΔΣ modulator to generate and apply the phase adjustment word. The reference source 410 comprises in this example three tapping transistors RCT1 to RCT3 having the same length and a binary weighted width. In FIG. 10, the switchable diode-connected transistors are sized to correspond to different phases according to the table.

| Word | Phase ° |
| --- | --- |
| 000 | 0 |
| 001 | 45 |
| 010 | 90 |
| 011 | 135 |
| 100 | 180 |
| 101 | 225 |
| 110 | 270 |
| 111 | 315 |

The final phase of the PLL output signal is given by the average of a ΔΣ phase adjustment signal. For example, the sequence 000, 000, 010, 001, 000, 000, 001, 001, 000, will give an average phase of 22.5°. To increase accuracy the switching between different phase control values are done between the charge-pump pulses when the charge pump current to the loop filter is off.

Figure 4:
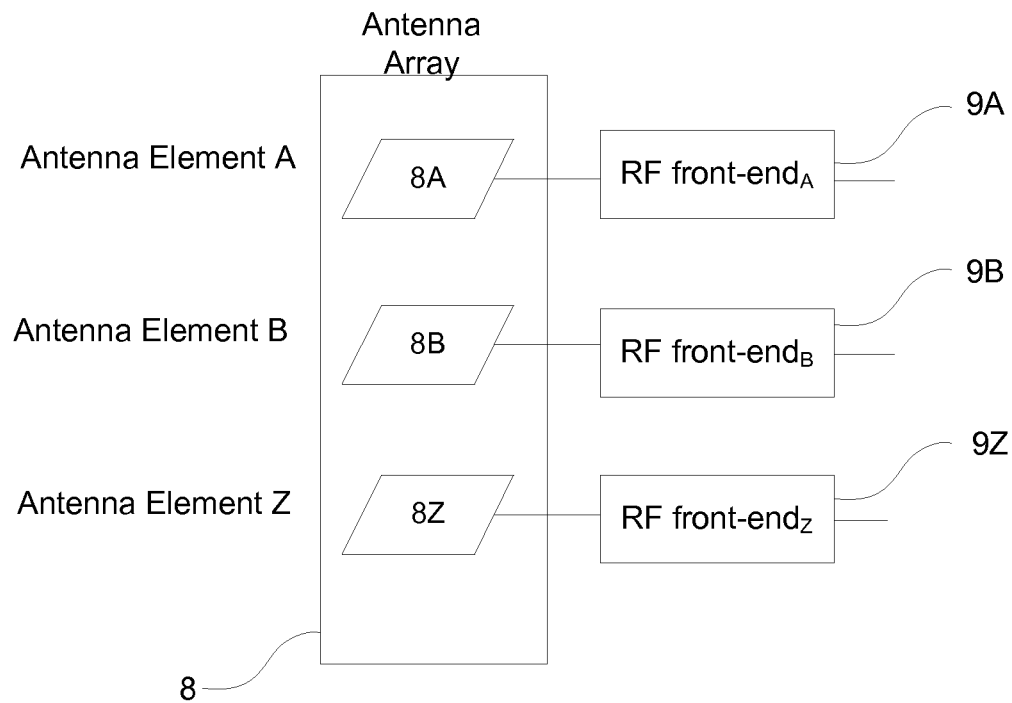
FIG. 4 illustrates a transceiver in accordance with aspects of the present disclosure.
Figure 5:
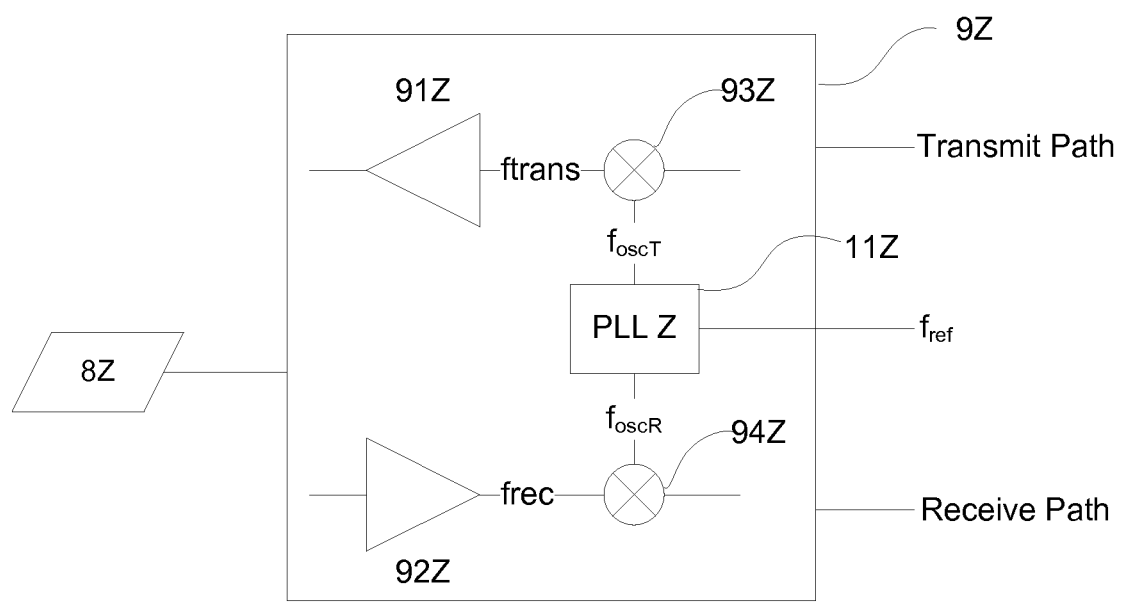
FIG. 5 shows an example of a transceiver element including transmitter and receiver in accordance with some aspect of the present disclosure.

FIG. 4 illustrates an application of the phase locked loop arrangement in a transceiver device. The term transceiver shall include not only a device able to transmit and receive signals, but also contain a pure transmitter or pure receiver. The transceiver herein is implemented as a beamforming system and comprises an antenna array 8 with a plurality of antenna elements 8A to 8Z. Each of the antenna elements may located at a different position in space and also point to a different direction. The antenna array may extend over a large area and several elements 8A to 8Z are separated and spaced apart from each other. For example an antenna array may cover an area from a few square centimetres up to several square meters and comprise up to hundreds of individual antenna elements located in that area. In one aspect, the antenna elements are in a fixed position with respect to each other. Each antenna element 8A to 8Z of the antenna array 8 is coupled to a respective RF front-end 9A to 9Z. The RF front-ends are configured to transmit signals to the respective elements, and also receive signals from it. Similar antenna arrays can be used in connection with pure transmitter or pure receiver devices. In accordance with aspects of the present disclosure, signals transmitted from the RF front-ends comprise—despite being modulated-different dedicated phase skews. These phase skews result in control of the direction of the signals being transmitted over the antenna array 8. This can be used to increase the signal strength in a receiver for demodulation. Likewise, any signal received via the antenna elements 9A to 9Z is processed in the respective RF front-end using phase shifted signals. Signals from a specific direction are constructively amplified or combined, while signal form a different direction not corresponding to the respective phase shifted signal are suppressed. Such processing is further illustrated in FIG. 5 showing an exemplary embodiment of an individual RF front-end 9Z.

Each of the RF front-ends is divided into a transmitter path for a transmission signal $f_{trans}$ and a reception path for processing a received signal frec. Each path comprises an up-mixer 93Z and down-mixer 94Z, respectively. The mixers are using a local oscillator signal foscT and foscR provided by a phase locked loop 11Z. In the transmission path, mixer 93Z is used to frequency up-convert or to modulate the data to be transmitted to the transmission signal ftrans. In this regard, the mixer units 93Z can be a classical mixer, a modulator of some sort, i.e. a quadrature modulator, any combination thereof or any other device using the oscillator signal $f_{oscT}$ to generate the transmission signal ftrans therefrom. The transmission signal is then amplified using amplifier 91Z and fed to antenna element 8Z connected thereto. Likewise a received signal frec is amplified using a low-noise amplification stage 92Z and then converted to a lower frequency using the oscillator signal foscR. The phase locked loop 11Z providing the oscillator signals is part of the phase locked loop arrangement as discussed previously. Accordingly, it comprises a frequency and phase adjustment input to adjust the frequency and phase of the oscillator signals $f_{oscT}$ and $f_{oscR}$. The phase locked loop 11Z may in some cases, like in a frequency division duplex (FDD) system, consist of two separate PLLs generating different frequencies for $f_{oscT}$ and $f_{oscR}$.

Figure 11:
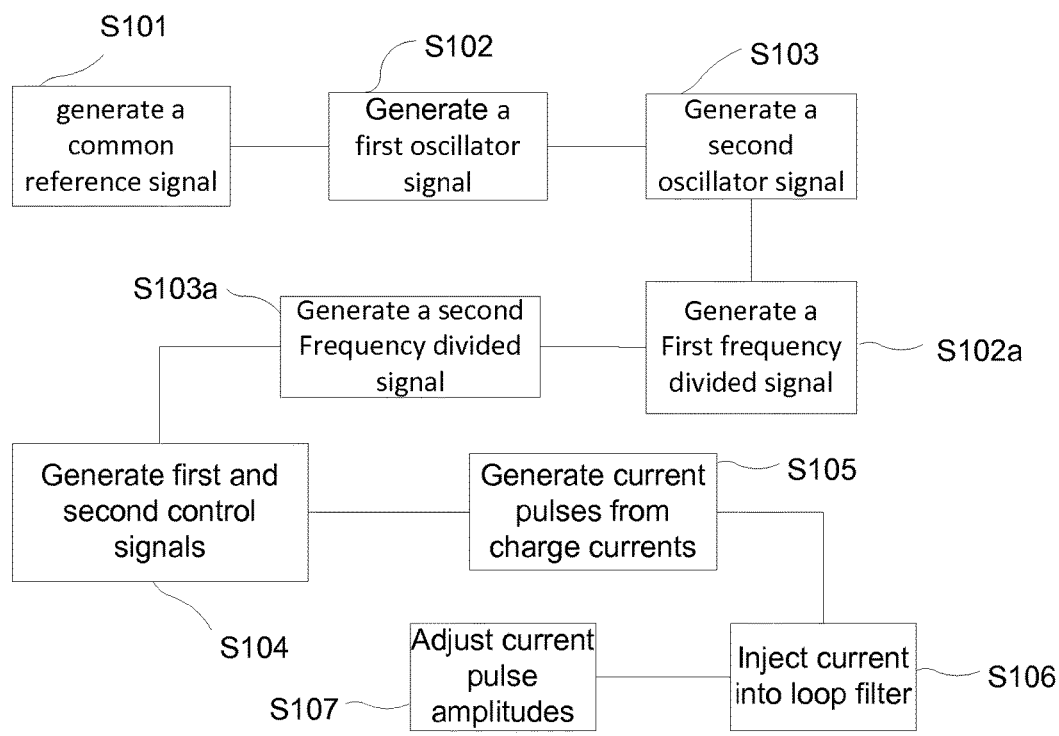
FIG. 11 illustrates a method to adjust the phase between oscillator signals in accordance with the disclosure.

FIG. 11 shows a method as it is for example used in an embodiment according to the previous figures. In the first steps S101 a common reference signal having a common reference frequency is generated. In steps S102 and S103 the first and at least one second oscillator signals are generated. They may have the same nominal frequency. The oscillator signals are then frequency divided in steps S102a and S103a, respectively. For phase and frequency locking the method continues with step S104, wherein respective control signals responsive to a phase deviation between the common reference signal and each of the first oscillator signal and the at least one second oscillator signal are generated. From these control signals respective charge current pulses are generated in step S105, which are transformed to control signals to change frequency and/or phase of the respective oscillator signals. The charge current pulses comprises in accordance with the disclosure a specified length responsive to a respective one of the control signals to control the frequency of the respective first and at least one second oscillator signal and a charge current. In step S106 a constant current is injected into the loop filter. This creates a phase skew of the output signal. In step S107 the phase skew is controlled by adjusting the current pulse amplitudes.

The present disclosure provides a phase locked loop arrangement with a plurality of phase locked loops with individually selectable phase values of its output signals. This selectable phase skew between two oscillator signals or between an oscillator signal and a nominal phase is achieved by injecting a constant current into the loop filter, and then controlling the charge pump current used for injecting charge pulses into the loop filter. By choosing a nonlinear control of the charge pump current the non-linear relation between the phase skew and the charge pump current is compensated resulting in an overall linear control of the phase skew. As a consequence the ratio between the phase control current and the total charge pump current becomes larger compared to tuning the injected constant current, which enables not only a good matching and high accuracy, but also reduces the chip area required for the adjustable current sources.

The invention claimed is:

1. A phase locked loop arrangement for a beamforming system, comprising:
a plurality of phase-adjustable phase locked loops, each configured to provide a respective oscillator signal and each comprising:
a frequency divider to provide a frequency divided signal based on the oscillator signal;
a phase comparator configured to output a respective control signal in response to a detection of a phase deviation between a common reference signal and the frequency divided signal;
an adjustable charge pump arrangement having a loop filter, and a charge pump with an adjustment input, wherein the charge pump is connected to the loop filter to inject an adjustable charge pump current into the loop filter; and
a constant current source configured to inject a first predetermined charge current into the loop filter;
wherein the adjustable charge pump arrangement is connected to the phase comparator to provide a voltage control signal to an oscillator of the phase-adjustable phase locked loop in response to the control signal and to generate a phase deviation between the oscillator signal of the phase-adjustable phase locked loop and an oscillator signal of at least one other phase-adjustable phase locked loop of the plurality of phase-adjustable phase locked loops, based on the charge pump comprising a current-mirror circuit that adjusts the adjustable charge pump current output by the charge pump into the loop filter in dependence on the value of an adjustment signal applied to the adjustment input; and
wherein the current-mirror circuit comprises a reference current side configured to receive a fixed reference current and generate an adjustable reference current responsive to the value of the adjustment signal, the adjustable reference current mirrored to an output side of the current-mirror circuit and output as the adjustable charge pump current.

2. The phase locked loop arrangement according to claim 1, wherein the loop filter comprises a capacitor configured to output the voltage control signal based on an amount of charge accumulated on the capacitor.

3. The phase locked loop arrangement according to claim 1, wherein the reference current side comprises at least two selectively switchable current paths, and wherein the value of the adjustment signal determines which one or ones of the at least two selectively switchable current paths are enabled, which in turn adjusts the adjustable charge pump current output by the charge pump.

4. The phase locked loop arrangement according to claim 1, wherein the current mirror has a non-linearly adjustable transfer ratio between its input side and its output side.

5. The phase locked loop arrangement according to claim 1, wherein the reference current side comprises a first transistor and at least one second transistor arranged in parallel to the first transistor, both transistors selectively switchable responsive to the value of the adjustment signal, to conduct a programmable portion of the fixed reference current, wherein the programmable portion of the fixed reference current controls adjustment of the adjustable charge pump current output by the charge pump.

6. The phase locked loop arrangement according to claim 5, wherein a transistor length and/or transistor width of the at least one second transistor is 2 times a transistor length and/or transistor width of the first transistor.

7. The phase locked loop arrangement according to claim 1, wherein the charge pump comprises a source path to provide a charge current and a drain path to provide a discharge current, and wherein the charge pump is configured to provide the charge current as the adjustable charge pump current.

8. The phase locked loop arrangement according to claim 1, wherein the constant current source comprises a further current mirror circuit, and wherein a same biasing transistor biases the current mirror circuit comprising the charge pump and the further current mirror circuit.

9. The phase locked loop arrangement according to claim 1, wherein the frequency divider is adjustable and operatively arranged between an output of the oscillator and an input of the phase comparator to provide the frequency divided signal to the phase comparator based on the oscillator signal and a frequency control word.

10. The phase locked loop arrangement according to claim 1, further comprising a reference signal generator configured to provide the common reference signal to each of the phase-adjustable phase locked loops.

11. A transmitter arrangement, comprising:
a phase locked loop arrangement according to claim 1; and
an antenna array having a plurality of antenna elements, wherein each of the antenna elements is in operative connection to a respective one of the phase-adjustable phase locked loops to receive an individual signal for transmission derived from the respective oscillator signal thereof.

12. A receiver arrangement, comprising:
a phase locked loop arrangement according to claim 1; and
an antenna array having a plurality of antenna elements, wherein each of the antenna elements is coupled to a respective one of the phase-adjustable phase locked loops to downconvert a received signal with the respective oscillator signal thereof.

* * * * *